(12) United States Patent  
Han et al.

(10) Patent No.: US 11,861,094 B2  
(45) Date of Patent: Jan. 2, 2024

(54) DISPLAY DEVICE WITH TOUCH SENSOR

(71) Applicant: LG Display Co., Ltd., Seoul (KR)

(72) Inventors: Bumhee Han, Paju-si (KR); JiWon Kim, Paju-si (KR); MinSeob Song, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/178,957

(22) Filed: Mar. 6, 2023

(65) Prior Publication Data

US 2023/0376135 A1    Nov. 23, 2023

(30) Foreign Application Priority Data

May 18, 2022  (KR) ......................... 10-2022-0060824

(51) Int. Cl.
*G06F 3/041*       (2006.01)
*H10K 50/844*    (2023.01)

(52) U.S. Cl.
CPC ......... *G06F 3/0412* (2013.01); *H10K 50/844* (2023.02); *G06F 2203/04112* (2013.01)

(58) Field of Classification Search
None
See application file for complete search history.

(56) References Cited

U.S. PATENT DOCUMENTS

| | | |
|---|---|---|
| 11,023,074 B2 | 6/2021 | Lee et al. |
| 11,429,223 B2 | 8/2022 | Lee et al. |
| 2020/0019294 A1 | 1/2020 | Lee et al. |
| 2021/0247886 A1 | 8/2021 | Lee et al. |

FOREIGN PATENT DOCUMENTS

| | | |
|---|---|---|
| KR | 10-2020-0008276 A | 1/2020 |
| KR | 10-2178197 B1 | 11/2020 |
| KR | 10-2321830 B1 | 11/2021 |

*Primary Examiner* — Nicholas J Lee
(74) *Attorney, Agent, or Firm* — Fenwick & West LLP

(57) ABSTRACT

A display device comprises a substrate including a display area having subpixels and a non-display area excluding the display area, an encapsulation layer that covers the subpixels, a first touch electrode line including a plurality of first touch sensing electrodes in a first direction on the encapsulation layer and spaced apart from each other in the first direction, a second touch electrode line in a same plane as the first touch electrode line and disposed in a second direction, a plurality of pads on one side of the substrate, a first touch routing wiring that connects some of the first touch electrode line and some pads among the plurality of pads and disposed between the plurality of first touch sensing electrodes in the second direction, and a second touch routing wiring that connects the second touch electrode line to some other pads among the plurality of pads.

20 Claims, 7 Drawing Sheets

DISPLAY DEVICE WITH TOUCH SENSOR

CROSS-REFERENCE TO RELATED APPLICATION

This application claims the priority benefit of the Republic of Korea Patent Application No. 10-2022-0060824 filed on May 18, 2022 in the Republic of Korea, which is hereby incorporated by reference in its entirety.

BACKGROUND

Technical Field

The present disclosure relates to a display device, and more particularly, to a display device with a touch sensor capable of sensing a touch.

Description of the Related Art

A touch screen is an input device capable of inputting a user's command using a person's hand or object by selecting an instruction content displayed on a screen such as a display device. The touch screen converts a contact position of the touch screen, which is in direct contact with a person's hand or object, into an electrical signal, and receives an indication of content selected at the contact position as an input signal. Since the touch screen may replace a separate input device connected to a display device such as a keyboard and a mouse, the use scope thereof is gradually expanded.

When the touch screen is applied to a large-sized or high-resolution display panel, the number of touch electrodes increases, thereby increasing the number of routing lines for connecting the touch electrodes to a touch driving circuit. Accordingly, there is a problem in that a non-display area in which the routing lines are disposed such as a bezel area increases in size.

SUMMARY

The present disclosure has been made in view of the above problems and other limitations associated with the related art, and one or more aspects of the present disclosure provides a display device with a touch sensor capable of reducing a size of a bezel area.

In accordance with an aspect of the present disclosure, a display device may include a substrate including a display area in which a plurality of subpixels are disposed and a non-display area excluding the display area, an encapsulation layer for covering the plurality of subpixels, a first touch electrode line including a plurality of first touch sensing electrodes disposed in a first direction on the encapsulation layer and spaced apart from each other in the first direction, a second touch electrode line provided in the same plane as the first touch electrode line and disposed in a second direction crossing the first direction, a plurality of pads disposed on one side of the substrate, a first touch routing wiring configured to connect some of the first touch electrode line and some among the plurality of pads and disposed between the plurality of first touch sensing electrodes in the second direction, and a second touch routing wiring configured to connect the second touch electrode line to some other pads among the plurality of pads.

In accordance with another aspect of the present disclosure, a display device may include a substrate including a display area in which a plurality of subpixels are disposed and a non-display area excluding the display area, a dam disposed close to the boundary between the display area and the non-display area on the substrate, an encapsulation layer for covering the plurality of subpixels and the dam, a first touch electrode line including a plurality of first touch sensing electrodes disposed in a first direction on the encapsulation layer and spaced apart from each other in the first direction, a second touch electrode line provided in the same plane as the first touch electrode line and disposed in a second direction crossing the first direction, a first touch routing wiring connected to the first touch electrode line in the display area and disposed in the second direction between the plurality of first touch sensing electrodes, and a second touch routing wiring connected to the second touch electrode line in the non-display area.

In addition to the features of the present disclosure as mentioned above, additional technical benefits and features of the present disclosure will be included within this description and drawings of the present disclosure.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principles of the disclosure.

In the drawings.

DETAILED DESCRIPTION

Figure 1:
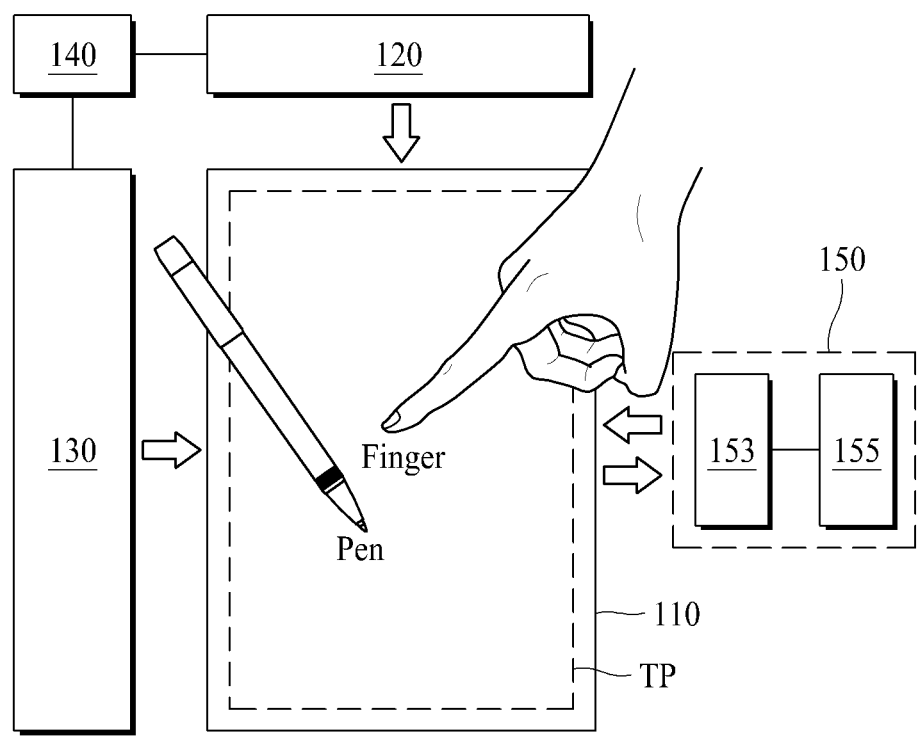
FIG. 1 is a system configuration diagram of a display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have', and 'include' described in the present disclosure are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be disposed between two other portions unless 'just' or 'direct' is used.

When an element or layer is referred to as being "on" another element or layer, one element or layer may be directly on another element or layer, or the other element or layer may be interposed between one element or layer and another element or layer.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In the drawings, the same or similar elements are denoted by the same reference numerals even though they are depicted in different drawings.

In the area and thickness of each component shown in the drawings are illustrated for convenience of description and are not necessarily limited to the area and thickness of the configuration shown in the present specification.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described with reference to the drawings.

FIG. 1 is a system configuration diagram of a display device according to one embodiment of the present disclosure.

Referring to FIG. 1, a display device 100 according to one embodiment of the present disclosure may provide both an image display function for displaying an image and a touch sensing function for sensing a touch and/or touch coordinates with respect to a touch operation by a touch object such as a user's finger and/or a pen et al.

In order to provide the image display function, the display device 100 according to one embodiment of the present disclosure may comprise a display panel 110 in which a plurality of data lines and a plurality of gate lines are disposed, and a plurality of subpixels defined by the plurality of data lines and the plurality of gate lines are arranged, a data driving circuit 120 configured to provide a data signal to the plurality of data lines, a gate driving circuit 130 configured to provide a gate signal to the plurality of gate lines, and a display controller 140 configured to control operations of the data driving circuit 120 and the gate driving circuit 130.

Each of the data driving circuit 120, the gate driving circuit 130, and the display controller 140 may be implemented as one or more individual components (e.g., circuits). In some cases, two or more of the data driving circuit 120, the gate driving circuit 130, and the display controller 140 may be implemented while being integrated into one component. For example, the data driving circuit 120 and the display controller 140 may be implemented as one integrated circuit (IC) chip.

In order to provide the touch sensing function, the display device according to one embodiment of the present disclosure may include a touch panel TP including a touch sensor, and a touch sensing circuit 150 which supplies a touch driving signal to the touch panel TP, detects a touch sensing signal from the touch panel TP, and senses whether a user touches or does not touch the touch panel TP, and also senses a touch position (touch coordinates) on the touch panel TP based on the detected touch sensing signal.

The touch sensing circuit 150 may include a touch driving circuit 153 which supplies the touch driving signal to the touch panel TP and detects the touch sensing signal from the touch panel TP, and a touch controller 155 which senses whether there is a user's touch and/or senses the touch position based on the touch sensing signal detected by the touch driving circuit 153.

The touch driving circuit 153 and the touch controller 155 may be implemented as separate components or may be integrated into one component, if needed.

Each of the data driving circuit 120, the gate driving circuit 130, and the touch sensing circuit 150 may be implemented as one or more integrated circuits, and may be implemented as a chip on glass COG type, a chip on film COF type, or a tape carrier package TCP type in terms of electrical connection with the display panel 110, and the gate driving circuit 130 may be implemented as a gate in panel GIP type.

Each of the circuit configurations 120, 130, and 140 for the display driving and the circuit configurations 153 and 155 for the touch sensing may be implemented as one or more individual components. If needed, one or more of the circuit configurations 120, 130, and 140 for the display driving and one or more of the circuit configurations 153 and 155 for the touch sensing may be functionally integrated and implemented in one or more components.

For example, the data driving circuit 120 and the touch driving circuit 153 may be integrated into one or more integrated circuit chips. When the data driving circuit 120 and the touch driving circuit 153 are integrated into two or more integrated circuit chips, each of the two or more integrated circuit chips may have the data driving function and the touch driving function.

Meanwhile, the display device 100 according to one embodiment of the present disclosure may be various types such as an organic light emitting display device, a micro LED display device, a quantum dot display device, and the like. Hereinafter, for convenience of description, an example of the display device 100 corresponding to the organic light emitting display device will be described.

The touch panel TP may include the touch sensor to which the touch driving signal may be applied or the touch sensing signal may be detected, and may further include touch routing wirings for electrically connecting the touch sensor and the touch driving circuit 153.

The touch sensor may include touch electrode lines. Each of the touch electrode lines may be a bar type of one electrode or a type in which touch electrodes are connected to each other. When each touch electrode line is the type in which the touch electrodes are connected to each other, each touch electrode line may include the plurality of touch electrodes and bridge patterns for connecting the touch electrodes.

In this case, the touch panel TP may be integrally formed with the display panel 110. When the display panel 110 is manufactured, the touch panel TP may be formed directly on the display panel 110. In addition, some of the components for the touch including the touch panel TP may be formed together with signal lines and the electrodes for the display driving.

Figure 2:
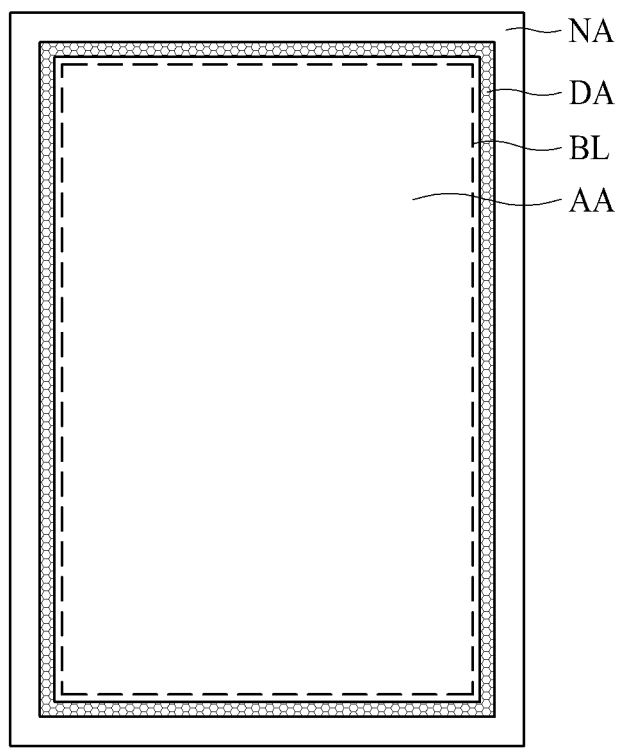
FIG. 2 schematically illustrates a display panel according to one embodiment of the present disclosure.

FIG. 2 schematically illustrates a display panel 110 according to one embodiment of the present disclosure.

Referring to FIG. 2, the display panel 110 may include a display area AA in which an image is displayed and a non-display area NA which is an outer area of a boundary line BL of the display area AA. The boundary line BL is the boundary line for dividing the display area AA and the non-display area NA.

A plurality of subpixels for displaying an image are arranged in the display area AA, and various electrodes or signal lines for driving the display are disposed.

In addition, a touch sensor for touch sensing and a plurality of touch routing wirings electrically connected to the touch sensor may be disposed in the display area AA. Accordingly, the display area AA may be referred to as a touch sensing area capable of touch sensing.

The non-display area NA may include link lines extending from various signal lines disposed in the display area AA or electrically connected to the signal lines, and display pads electrically connected to the link lines. The display pads disposed in the non-display area NA may be directly bonded or electrically connected to the display driving circuits 120 and 130. For example, the display pads disposed in the non-display area NA may include data pads to which data link lines, in which data lines are extended or electrically connected, are connected.

Also, the touch routing wirings electrically connected to the touch sensor disposed in the display area AA and the touch pads electrically connected to the touch routing wirings may be disposed in the non-display area NA. The touch pads disposed in the non-display area NA may be bonded or electrically connected to the touch driving circuit 153.

A portion of the plurality of touch electrode lines disposed in the display area AA may extend to the non-display area NA, and one or more electrodes of the same material as the plurality of touch electrode lines disposed in the display area AA may be further disposed in the non-display area NA. A portion of the outermost touch electrode among the plurality of touch electrodes included in each of the plurality of touch electrode lines disposed in the display area AA may extend to the non-display area NA, and one or more electrodes of the same material as the plurality of touch electrodes included in each of the plurality of touch electrode lines disposed in the display area AA may be further disposed.

The touch sensor may exist in the display area AA, most of the touch sensor may exist in the display area AA, and a portion of the touch sensor may exist in the non-display area NA or may exist over the display area AA and the non-display area NA.

Referring to FIG. 2, the display panel 110 according to one embodiment of the present disclosure may include a dam area DA in which at least one dam is disposed. The dam area DA prevents or at least reduces an organic layer of an encapsulation layer disposed in the display area AA from flowing out to the outside of the display panel 110.

The dam area DA may exist close to the boundary portion or may exist in the boundary portion between the display area AA and the non-display area NA. For example, the dam area DA may refer to a peripheral area of a point where a slope of the encapsulation layer becomes gentle in a direction down along an inclined surface of the encapsulation layer.

At least one dam disposed in the dam area DA may be disposed to surround the display area AA or may not be disposed in a portion of the display area AA. For example, when the display panel 110 has a quadrangular shape, the dam may be disposed to surround all four directions or may be disposed only in one to three directions.

In addition, at least one dam disposed in the dam area DA may be a single pattern or two or more disconnected patterns.

For example, when two dams are disposed in the dam area DA, the dam closest to the display area AA may be referred to as a first dam, and the other dam may be referred to as a second dam. In the dam area DA, there may be the first dam in one direction without the second dam in the one direction and both the first dam and the second dam in another direction.

Figure 3:
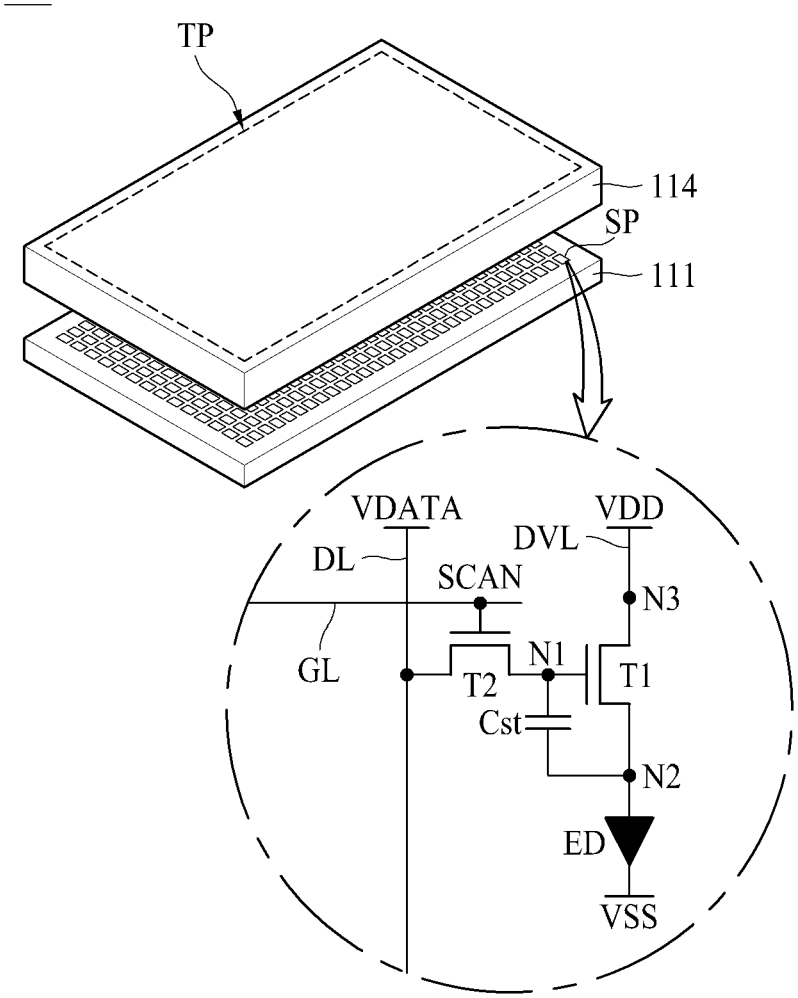
FIG. 3 exemplarily illustrates a structure in which a touch panel is embedded in a display panel according to one embodiment of the present disclosure.

FIG. 3 exemplarily illustrates a structure in which a touch panel is embedded in a display panel according to one embodiment of the present disclosure.

Referring to FIG. 3, a plurality of subpixels SP are arranged in a display area AA on a substrate 111 of a display panel 110.

Each of the subpixels SP may include a light emitting element ED, a first transistor T1 for applying a driving current to the light emitting element ED, a second transistor T2 for transferring a data voltage VDATA to a first node N1 of the first transistor T1, and a capacitor Cst for maintaining a predetermined voltage for one frame.

The first transistor T1 may include the first node N1 to which the data voltage VDATA is applied, a second node N2 electrically connected to the light emitting element ED, and a third node N3 to which a driving voltage VDD is applied from a driving voltage line DVL. The first node N1 may be a gate node, the second node N2 may be a source node or a drain node, and the third node N3 may be a drain node or a source node. The first transistor T1 may be also referred to as a driving transistor for driving the light emitting element ED.

The light emitting element ED may include an anode electrode, a light emitting layer, and a cathode electrode. The anode electrode may be applied with the data voltage VDATA corresponding to a different pixel voltage for each subpixel SP, and may be electrically connected to the second node N2 of the first transistor T1. The cathode electrode may be applied with a base voltage VSS corresponding to a common voltage commonly applied to all the subpixels SP.

The light emitting element ED may be a light emitting element ED using an organic material or a light emitting element ED using an inorganic material. In the light emitting element ED using an organic material, a light emitting layer may include an organic light emitting layer including an organic material. In this case, the light emitting element ED may be referred to as an organic light emitting diode.

The second transistor T2 is turned-on and turned-off by a scan signal SCAN applied through the gate line GL, and may be electrically connected between the data line DL and the first node N1 of the first transistor T1. The second transistor T2 may be also referred to as a switching transistor. When the second transistor T2 is turned-on by the scan signal SCAN, the second transistor T2 transfers the data voltage VDATA supplied from the data line DL to the first node N1 of the first transistor T1.

The capacitor Cst may be electrically connected between the first node N1 and the second node N2 of the first transistor T1.

Each of the subpixels SP may have a structure including the two transistors T1 and T2 and one capacitor Cst, as shown in FIG. 3, but not limited thereto. Each of the subpixels SP may have a structure including three or more transistors and one or more capacitors.

Each of the first transistor T1 and the second transistor T2 may be an N-type transistor or a P-type transistor.

Meanwhile, the light emitting element ED and a pixel circuit including two or more transistors T1 and T2 for applying the driving current to the light emitting element ED and one or more capacitor Cst may be disposed on the display panel 110. Since the light emitting element ED and the pixel circuit are vulnerable to external moisture or oxygen, the encapsulation layer 114 for preventing or at least reducing external moisture or oxygen from penetrating into the light emitting element ED and the pixel circuit may be disposed on the display panel 110.

The encapsulation layer 114 may be formed of one layer or a plurality of layers. For example, when the encapsulation layer 114 is composed of a plurality of layers, the encapsulation layer 114 may include one or more inorganic encapsulation layers and one or more organic encapsulation layers. For example, the encapsulation layer 114 may include a first inorganic encapsulation layer, an organic encapsulation layer, and a second inorganic encapsulation layer. In this case, the organic encapsulation layer may be positioned between the first inorganic encapsulation layer and the second inorganic encapsulation layer. In addition, the organic encapsulation layer may be formed onto the dam area DA and may not be formed outside the dam area DA.

The first inorganic encapsulation layer may be formed on the cathode electrode while being closest to the light emitting element ED. For example, the first inorganic encapsulation layer may be formed of an inorganic insulating material capable of being deposited at a low temperature, such as silicon nitride SiNx, silicon oxide SiOx, silicon oxynitride SiON, or aluminum oxide Al2O3. Accordingly, since the first inorganic encapsulation layer is deposited in a low temperature atmosphere, it is possible to prevent or at least reduce the light emitting layer, which is vulnerable to a high temperature atmosphere, from being damaged for a deposition process of the first inorganic encapsulation layer.

The organic encapsulation layer may be formed to have an area smaller than that of the first inorganic encapsulation layer, and may be formed to expose both ends of the first inorganic encapsulation layer. The organic encapsulation layer serves as a buffer for mitigating stress between the respective layers caused by the bending of the display device 100, and enhances a planarization performance. For example, the organic encapsulation layer may be formed of an organic insulating material such as acrylic resin, epoxy resin, polyimide, polyethylene, or silicon oxycarbon SiOC.

The second inorganic encapsulation layer is provided on the organic encapsulation layer and is configured to cover an upper surface and a side surface of each of the organic encapsulation layer and the first inorganic encapsulation layer. Accordingly, the second inorganic encapsulation layer may prevent or at least reduce external moisture or oxygen from penetrating into the first inorganic encapsulation layer and the organic encapsulation layer. For example, the second inorganic encapsulation layer may include an inorganic insulating material such as silicon nitride SiNx, silicon oxide SiOx, silicon oxynitride SiON, or aluminum oxide Al2O3.

In the display device 100 according to one embodiment of the present disclosure, the touch panel TP may be disposed on the encapsulation layer 114. Specifically, the touch sensor included in the touch panel TP may be disposed on the encapsulation layer 114. The touch panel TP may include a touch sensor, a touch pad, a touch routing wiring, and the like.

A method capable of sensing whether there is a touch and/or obtaining touch coordinates by use of the touch sensor may be a method for detecting a change in self-capacitance or a method for detecting a change in mutual capacitance. The display device 100 according to one embodiment of the present disclosure describes a case of sensing a touch on the basis of a mutual capacitance.

Figure 4:
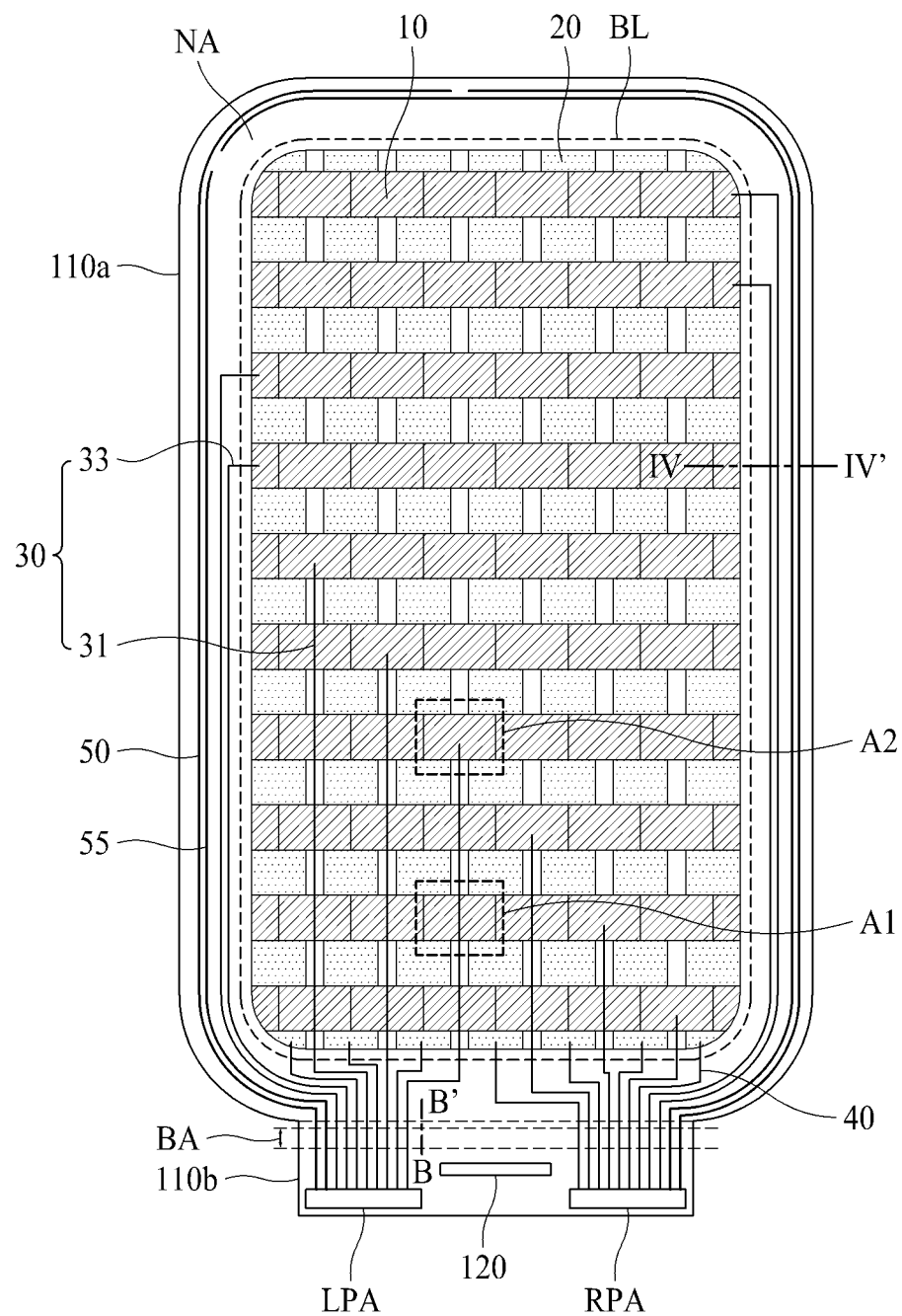
FIG. 4 schematically illustrates an arrangement structure of a touch sensor in a display panel according to one embodiment of the present disclosure.

FIG. 4 schematically illustrates an arrangement structure of the touch sensor in the display panel according to one embodiment of the present disclosure.

Referring to FIG. 4, the touch sensor includes a plurality of first touch electrode lines 10 and a plurality of second touch electrode lines 20 disposed on the encapsulation layer 114 in the display area AA. As shown in the drawings, for example, the plurality of first touch electrode lines 10 are disposed in a first direction (horizontal direction), and the plurality of second touch electrode lines 20 are disposed in a second direction (vertical direction).

The plurality of first touch electrode lines 10 may include a plurality of first touch sensing electrodes and a plurality of first connection electrodes for connecting the plurality of first touch sensing electrodes. In addition, the second touch electrode line 20 may include a plurality of second touch sensing electrodes and a plurality of second connection electrodes for connecting the plurality of second touch sensing electrodes. The first connection electrode is disposed on a different layer from the first touch sensing electrode. However, the second connection electrode is disposed in a spaced area between the two adjacent first touch sensing electrodes to connect the two second touch sensing electrodes adjacent to each other in the vertical direction. In this case, the second connection electrode is disposed on the same layer as the second touch sensing electrode and is formed of the same material as the second touch sensing electrode. The second touch sensing electrode is extended to form the second connection electrode. That is, the second touch electrode line 20 is an integrated electrode line having two different widths.

Each of the plurality of first touch sensing electrodes and the plurality of second touch sensing electrodes has a rectangular shape, but is not limited thereto. Each of the plurality of first touch sensing electrodes and the plurality of second touch sensing electrodes may have a rhombus shape, or a triangle shape, or the shapes of the first touch sensing electrodes and second touch sensing electrodes may be mixed with rhombus and triangle shapes. The detailed shape and arrangement of the first touch electrode line 10 and the second touch electrode line 20 will be described in detail in the following drawings.

The plurality of first touch electrode lines 10 and the plurality of second touch electrode lines 20 may be disposed inside the outer boundary line BL of the display area AA, but not limited thereto. A portion of the first touch sensing electrode or the second touch sensing electrode adjacent to the outer boundary line BL of the display area AA may be disposed in the non-display area NA beyond the outer boundary line BL of the display area AA.

The display panel 110 according to one embodiment of the present disclosure has a rectangular shape with rounded corners as an example, but not limited thereto. The first touch sensing electrode or the second touch sensing electrode disposed at the edge of the display panel 110 may be disposed while being provided in the same shape as the shape of the edge of the display panel 110.

The display panel 110 includes a first display panel area 110a in which the plurality of first touch electrode lines 10 and the plurality of second touch electrode lines 20 are disposed to enable the touch sensing, and the plurality of subpixels SP are disposed to display an image, and a second display panel area 110b including a bending area BA and extended from the first display panel area 110a to be disposed on the rear surface of the first display panel area 110a. The second display panel area 110b may include the display pad, the touch pad, and the data driving circuit 120. The second display panel area 110b is included in the non-display area NA.

The data driving circuit 120 is disposed in the center of the second display panel area 110b, and the touch pad may be disposed on the left/right side with respect to the data driving circuit 120 in one embodiment. In the second display panel area 110b, a first touch pad area LPA is disposed on the left side of the data driving circuit 120, and a second touch pad area RPA is disposed on the right side of the data driving circuit 120.

The touch routing wirings 30 and 40 include a plurality of first touch routing wirings 30 and a plurality of second touch routing wirings 40. The plurality of first touch routing wirings 30 are lowered along the inclined surface of the encapsulation layer 114 and are configured to electrically connect the plurality of first touch electrode lines 10 to the plurality of touch pads disposed in the first touch pad area LPA or the second touch pad area RPA. The plurality of second touch routing wirings 40 are lowered along the inclined surface of the encapsulation layer 114 and are configured to electrically connect the plurality of second touch electrode lines 20 to the plurality of touch pads disposed in the first touch pad area LPA or the second touch pad area RPA.

The display device 100 according to one embodiment of the present disclosure may detect the change in mutual capacitance between the first touch electrode line 10 and the second touch electrode line 20, to thereby sense a finger touch or a pen touch on the basis of the change.

Each of the plurality of first touch electrode lines 10 may be disposed in a first direction, and each of the plurality of second touch electrode lines 20 may be disposed in a second direction which is different from the first direction. The first direction and the second direction may be perpendicular to each other but may not be perpendicular to each other.

The plurality of first touch routing wirings 30 include an external routing wiring 33 which is connected to one side or the other side of the plurality of first touch electrode lines 10, disposed along the non-display area NA of the display panel 110, and connected to the plurality of touch pads disposed in the first touch pad area LPA or the second touch pad area RPA. In addition, the plurality of first touch routing wirings 30 include an internal routing wiring 31 which is connected to the first touch sensing electrode rather than one side and the other side of the first touch electrode line 10, disposed in a second direction in the display area AA of the display panel 110, and connected to the plurality of touch pads disposed in the first touch pad area LPA or the second touch pad area RPA.

The first touch routing wiring 30 includes at least one internal routing wiring 31. According as the number of internal routing wirings 31 is increased, the number of external routing wirings 33 is reduced so that it is possible to decrease the width of the non-display area NA.

In case of the plurality of second touch electrode lines 20, the touch pad area LPA and RPA may be disposed in the second direction and may be provided on one side of the plurality of second touch electrode lines 20. The plurality of second touch routing wirings 40 may be connected to one side of the plurality of second touch electrode lines 20 and may be connected to the plurality of touch pads disposed in the first touch pad area LPA and the second touch pad area RPA.

In FIG. 4, only one side of the second touch electrode line 20 is connected to the second touch routing wiring 40, but not limited thereto. The second touch routing wiring 40 may be connected to the other side of the second touch electrode line 20 and then may be connected to the touch pad. Also, in order to improve touch sensitivity, the second touch routing wiring 40 may include both the routing wiring connected to one side of the second touch electrode line 20 and connected to the touch pad, and the routing wiring connected to the other side of the second touch electrode line 20 and connected to the touch pad.

The first touch routing wiring 30 and the second touch routing wiring 40 may be formed of the same material as the first touch electrode line 10 and the second touch electrode line 20, and may be provided on the same layer as the first touch electrode line 10 and the second touch electrode line 20. The first touch routing wiring 30 and the second touch routing wiring 40 may be jumped in the upper/lower portions of the bending area BA adjacent to the bending area BA to pass through the bending area BA and then may be connected to the wiring in the other layer.

Meanwhile, the internal routing wiring 31 is disposed in the spaced area between the two adjacent second touch electrode lines 20. Also, the internal routing wiring 31 passes through the plurality of first touch electrode lines 10 between the first touch electrode line 10 to be connected and the pad area LPA and RPA. As described above, since the plurality of first touch electrode lines 10 include the plurality of first touch sensing electrodes, the internal routing wiring 31 is disposed in the spaced area between the two adjacent first touch sensing electrodes. Therefore, the internal routing wiring 31, the first touch sensing electrodes, and the second touch electrode line 20 may be disposed on the same layer.

In the display panel 110 according to one embodiment of the present disclosure, the internal routing wiring 31 is disposed inside the display area AA in which touch sensing electrodes are disposed, so that it is possible to reduce the size of the non-display area NA.

In addition, as shown in FIG. 4, in case of the first touch electrode line 10 disposed adjacent to the touch pad area LPA and RPA, the first touch electrode line 10 and the touch pad may be connected through the internal routing wiring 31. In case of the first touch electrode line 10 disposed relatively far away from the touch pad area LPA and RPA, the first touch electrode line 10 and the touch pad may be connected through the external routing wiring 33. The width of the internal routing wiring 31 is smaller than the width of the external routing wiring 33. For example, the internal routing wiring 31 is 3 μm and the external routing wiring 33 is 10 μm.

Since the width of the internal routing wiring 31 is smaller (less) than the width of the external routing wiring 33, the resistance of the internal routing wiring 31 is greater than the resistance of the external routing wiring 33. Therefore, the first touch electrode line 10 disposed closer to the touch pad area LPA and RPA is connected to the internal routing wiring 31, and the first touch electrode line 10 disposed farther away from the touch pad area LPA and RPA is connected to the external routing wiring 33, so that it is possible to reduce the difference in resistance of the first touch routing wiring 30, which varies according to the position of the first touch electrode line 10.

In addition, due to the resistance difference of the first touch routing wiring 30, which occurs even though the internal routing wiring 31 is disposed, an isoresistance design area may be additionally provided in the second display panel area 110b adjacent to the touch pad area LPA and RPA. The widths of the first touch routing wirings 30 disposed in the isoresistance design area may be different from each other.

The second touch routing wirings 40 may also be disposed in the isoresistance design area.

A first ground wiring 50 and a second ground wiring 55 may be disposed along the circumference of the display area AA on the encapsulation layer 114 of the non-display area NA.

The first ground wiring 50 quickly discharges or blocks static electricity so as not to be affected by static electricity during the touch sensing, thereby preventing or at least reducing a touch sensing error or degradation of sensing sensitivity. Therefore, the first ground wiring 50 is disposed outside the second ground wiring 55 with respect to the display panel 110, thereby improving an electrostatic blocking effect. Also, '0V' corresponding to a ground voltage may be applied to the first ground wiring 50. Herein, one side of the first ground wiring 50 is connected to the first touch pad in the first touch pad area LPA, and the other side of the first ground wiring 50 is connected to the second touch pad in the second touch pad area RPA.

The second ground wiring 55 may be disposed along the circumference of the display area AA on the encapsulation layer 114 of the non-display area NA. The second ground wiring 55 may be disposed in parallel with the first ground wiring 50. In FIG. 4, the second ground wiring 55 is disposed closer to the display area AA than the first ground wiring 50, but not limited thereto. Since the second ground wiring 55 is disposed closer to the display area AA than the first ground wiring 50, the second ground wiring 55 may be disposed closer to the first touch electrode line 10 and the second touch electrode line 20, thereby reducing touch noise between the first touch electrode line 10 and the second touch electrode line 20 and improving touch performance. The same voltage as a voltage range applied to the second touch electrode line 20 may be applied to the second ground wiring 55. Herein, one side of the second ground wiring 55 may be connected to the first touch pad in the first touch pad area LPA, and the other side of the second ground wiring 55 may be connected to the second touch pad in the second touch pad area RPA.

As shown in FIG. 4, the first ground wiring 50 and the second ground wiring 55 are formed by cutting the wiring once without forming a closed loop. Accordingly, it is possible to prevent or at least reduce the first ground wiring 50 and the second ground wiring 55 from bursting (being damaged) by external noise.

In addition, the disconnection positions of the first ground wiring 50 and the second ground wiring 55 are located toward the center of the upper end of the display panel 110 while being far from the touch pad area LPA and RPA. Thus, the resistances of the left and right wirings of each of the first ground wiring 50 and the second ground wiring 55 may be similarly adjusted with respect to the disconnection location.

Also, the disconnection positions of the first ground wiring 50 and the second ground wiring 55 may be different from each other. When the disconnection positions of the first ground wiring 50 and the second ground wiring 55 are the same, static electricity or noise may flow into the first ground wiring 50 or the second ground wiring 55. Therefore, the first ground wiring 50 and the second ground wiring 55 have the different disconnection positions, thereby effectively preventing or at least reducing static electricity and noise.

As described above, an enlarged view of 'A1' area and 'A2' area will be shown to describe specific shapes and arrangement of the first touch electrode line 10 and the second touch electrode line 20.

Figure 5:
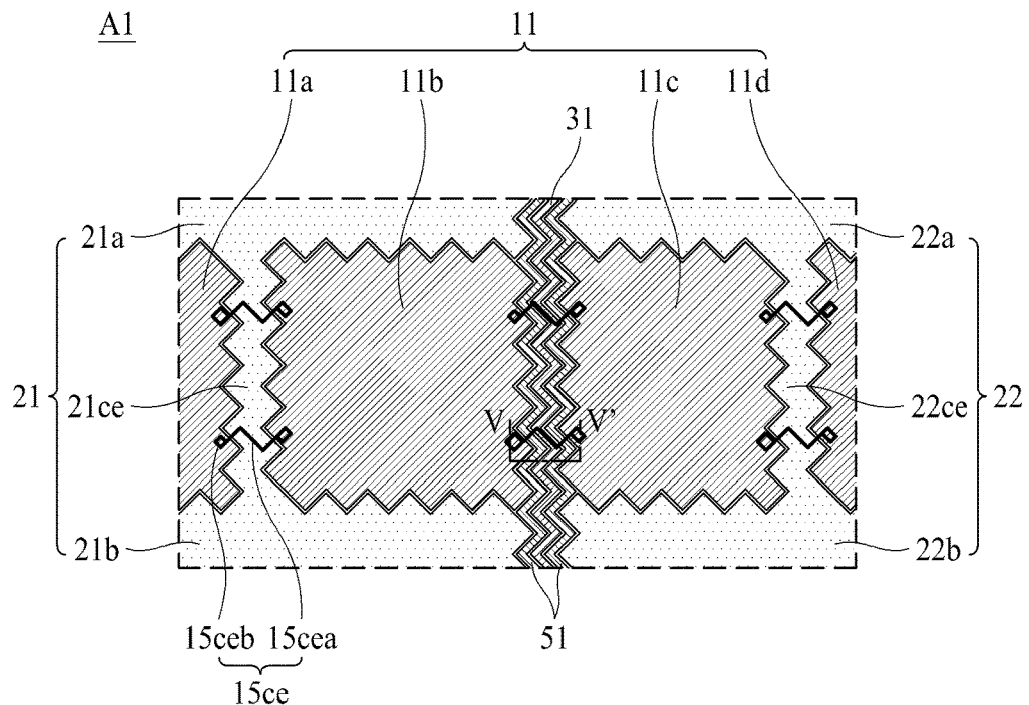
FIG. 5 is an enlarged view of 'A1' area of FIG. 4 according to one embodiment of the present disclosure.

FIG. 5 is an enlarged view of 'A1' area of FIG. 4 according to one embodiment.

Referring to FIG. 5, 'A1' area corresponds to the area in which the internal routing wiring 31 passes through the first touch electrode line 10.

When any one of the plurality of first touch electrode lines 10 is referred to as an eleventh (11th) touch electrode line 11, four of 11th touch sensing electrodes among a plurality of eleventh touch sensing electrodes included in the 11th touch electrode line 11 are included in the 'A1' area. The four of 11th touch sensing electrodes are spaced apart from each other and are referred to as a 111th sub-touch sensing electrode 11a, a 112th sub-touch sensing electrode 11b, a 113th sub-touch sensing electrode 11c, and a 114th sub-touch sensing electrode 11d, respectively.

The distance between the 111th sub-touch sensing electrode 11a and the 112th sub-touch sensing electrode 11b, the distance between the 112th sub-touch sensing electrode 11b and the 113th sub-touch sensing electrode 11c, and the distance between the 113th sub-touch sensing electrode 11c and the 114th sub-touch sensing electrode are the same, but not limited thereto.

The 11th touch electrode line 11 includes a plurality of first connection electrodes 15ce configured to connect the 111th sub-touch sensing electrode 11a and the 112th sub-touch sensing electrode 11b to each other, configured to connect the 112th sub-touch sensing electrode 11b and the 113th sub-touch sensing electrode 11c to each other, and configured to connect the 113th sub-touch sensing electrode 11c and the 114th sub-touch sensing electrode 11d to each other. The plurality of first connection electrodes 15ce are disposed on a layer different from the 111th sub-touch sensing electrode 11a, the 112th sub-touch sensing electrode 11b, the 113th sub-touch sensing electrode 11c, and the 114th sub-touch sensing electrode 11d. Specifically, each of the plurality of first connection electrodes 15ce includes a connection wiring 15cea and a contact electrode 15ceb.

In the drawings, it shows the two of first connection electrodes 15ce for connecting the adjacent sub-touch sensing electrodes, but not limited thereto. It is possible to provide a single number of first connection electrode 15ce or three or more of the first connection electrodes 15ce.

In addition, the 'A1' area includes two of the second touch electrode lines adjacent to each other among the plurality of second touch electrode lines 20. The two of second touch electrode lines are spaced apart from each other and are referred to as a 21st touch electrode line 21 and a 22nd touch electrode line 22, respectively.

The 21st touch electrode line 21 includes a 211th sub-touch sensing electrode 21a, a 212th sub-touch sensing electrode 21b, and a 21st connection electrode 21ce for connecting together the 211 sub-touch sensing electrode 21a and the 212 sub-touch sensing electrode 21b. The 21st touch electrode line 21 is spaced apart from the 111th sub-touch sensing electrode 11a and the 112th sub-touch sensing electrode 11b.

The 22nd touch electrode line 22 includes a 221st sub-touch sensing electrode 22a, a 222nd sub-touch sensing electrode 22b, and a 22nd connection electrode 22ce for connecting together the 221st sub-touch sensing electrode 22a and the 222nd sub-touch sensing electrode 22b. The 22nd touch electrode line 22 is spaced apart from the 113th sub-touch sensing electrode 11c and the 114th sub-touch sensing electrode 11d.

As shown in FIG. 5, the 11th touch electrode line 11, the 21st touch electrode line 21, and the 22nd touch electrode line 22 are adjacent to each other, and the edges of the touch sensing electrodes included in each of the touch electrode lines may include a plurality of vertices in a zigzag form, but not limited thereto. For example, the edge of the touch sensing electrodes may be a straight line or a curved line. Visibility of the touch electrode lines may be reduced by forming the edges of the touch sensing electrodes in a zigzag shape.

Meanwhile, the internal routing wiring 31 is disposed in the spaced area between the 112th sub-touch sensing electrode 11b and the 113th sub-touch sensing electrode 11c. The internal routing wiring 31 is spaced apart from the 112th sub-touch sensing electrode 11b and the 113th sub-touch sensing electrode 11c. The internal routing wiring 31 may be disposed on the same layer as the sub-touch sensing electrodes and may be formed of the same material as the sub-touch sensing electrodes.

A third ground wiring 51 may be further disposed in the spaced area between the 112th sub-touch sensing electrode 11b and the 113th sub-touch sensing electrode 11c. The third ground wiring 51 may be disposed in the spaced area between the 112th sub-touch sensing electrode 11b and the internal routing wiring 31 and the spaced area between the internal routing wiring 31 and the 113th sub-touch sensing electrode 11c. The third ground wiring 51 is spaced apart from the 112th sub-touch sensing electrode 11b, the 113th sub-touch sensing electrode 11c, and the internal routing wiring 31. The third ground wiring 51 may be disposed on the same layer as the sub-touch sensing electrodes and may be formed of the same material as the sub-touch sensing electrodes. The third ground wiring 51 may reduce noise of the signal transmitted through the internal routing wiring 31 by blocking the signal transmitted from the area adjacent to the internal routing wiring 31. Specifically, since the internal routing wiring 31 is connected to any one of the first touch electrode lines 10, the third ground wiring 51 prevents unnecessary capacitance formation between the touch signal transmitted through the second touch electrode line 20 adjacent to the first touch electrode line and the touch signal transmitted through the internal routing wiring 31.

Since both the internal routing wiring 31 and the third ground wiring 51 are disposed adjacent to the sub-touch sensing electrodes, the internal routing wiring 31 and the third ground wiring 51 are formed to be the same as the shape of the sub-touch sensing electrodes. Accordingly, the internal routing wiring 31 and the third ground wiring 51 may have a zigzag shape, but not limited thereto. For example, the internal routing wiring 31 and the third ground wiring 51 may be in the form of a straight line or a curved line.

Accordingly, as the third ground wiring 51 is connected to the first ground wiring 50, the third ground wiring 51 may receive a ground voltage through the first ground wiring 50, but not limited thereto. For example, the third ground wiring 51 may be floated, and thus may serve as a dummy electrode.

Figure 6:
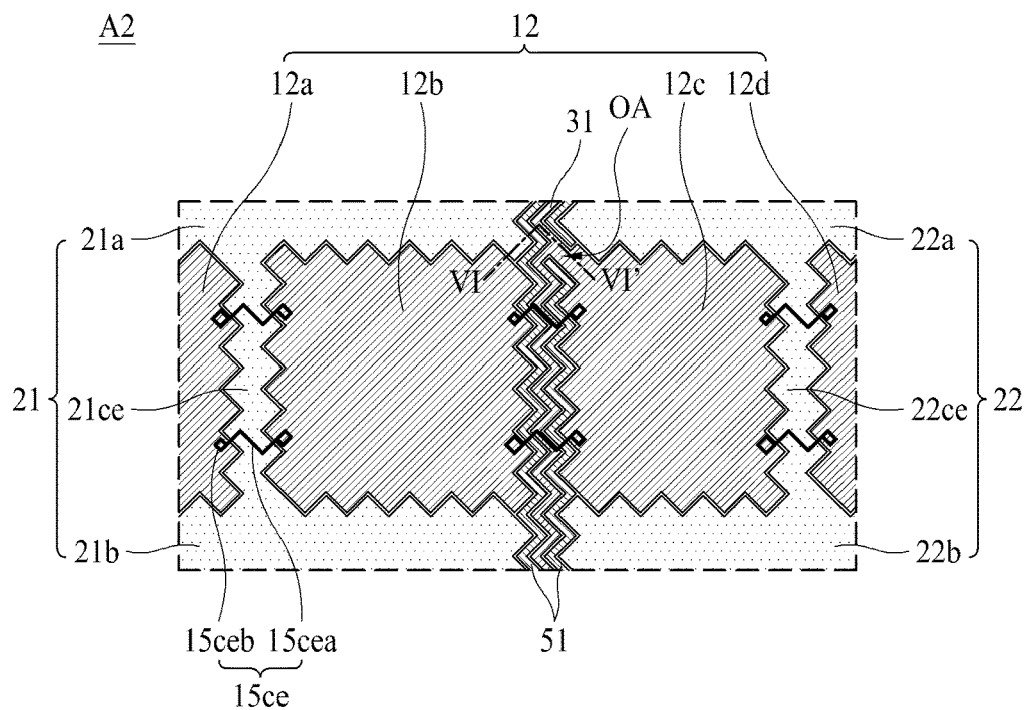
FIG. 6 is an enlarged view of 'A2' area of FIG. 4 according to one embodiment of the present disclosure.

FIG. 6 is an enlarged view of 'A2' area of FIG. 4 according to one embodiment.

Referring to FIG. 6, the 'A2' area is the area in which the internal routing wiring 31 is electrically connected to the first touch electrode line 10. When any one of the plurality of first touch electrode lines 10 is referred to as a twelfth (12th) touch electrode line 12, four of 12th touch sensing electrodes among a plurality of 12th touch sensing electrodes included in the 12th touch electrode line 12 are included in the 'A2' area. The four of 12th touch sensing electrodes are spaced apart from each other, and are referred to as a 121st sub-touch sensing electrode 12a, a 122nd sub-touch sensing electrode 12b, a 123rd sub-touch sensing electrode 12c, and a 124th sub-touch sensing electrode 12d, respectively.

The distance between the 121st sub-touch sensing electrode 12a and the 122nd sub-touch sensing electrode 12b, the distance between the 122nd sub-touch sensing electrode 12b and the 123rd sub-touch sensing electrode 12c, and the distance between the 123rd sub-touch sensing electrode 12c and the 124th sub-touch sensing electrode 12d are the same, but not limited thereto.

The 12th touch electrode line 12 includes a plurality of first connection electrodes 15ce configured to connect the 121st sub-touch sensing electrode 12a and the 122nd sub-touch sensing electrode 12b to each other, configured to connect the 122nd sub-touch sensing electrode 12b and the 123rd sub-touch sensing electrode 12c to each other, and configured to connect the 123rd sub-touch sensing electrode 12c and the 124th sub-touch sensing electrode 12d to each other. The plurality of first connection electrodes 15ce are disposed on a layer different from the 121st sub-touch sensing electrode 12a, the 122nd sub-touch sensing electrode 12b, the 123rd sub-touch sensing electrode 12c, and the 124th sub-touch sensing electrode 12d. As described above, each of the plurality of first connection electrodes 15ce includes a connection wiring 15cea and a contact electrode 15ceb.

In the drawings, it shows two first connection electrodes 15ce for connecting the adjacent sub-touch sensing electrodes, but not limited thereto. It is possible to provide a single first connection electrode 15ce or three or more of the first connection electrodes 15ce.

In addition, the 'A2' area includes two of the second touch electrode lines adjacent to each other among the plurality of second touch electrode lines 20. The two of second touch electrode lines are spaced apart from each other and are referred to as a 21st touch electrode line 21 and a 22nd touch electrode line 22, respectively.

The 21st touch electrode line 21 includes a 211th sub-touch sensing electrode 21a, a 212th sub-touch sensing electrode 21b, and a 21st connection electrode 21ce for connecting the 211th sub-touch sensing electrode 21a and the 212th sub-touch sensing electrode 21b. The 21st touch electrode line 21 is spaced apart from the 121st sub-touch sensing electrode 12a and the 122nd sub-touch sensing electrode 12b.

The 22nd touch electrode line 22 includes a 221st sub-touch sensing electrode 22a, a 222nd sub-touch sensing electrode 22b, and a 22nd connection electrode 22ce for connecting the 221st sub-touch sensing electrode 22a and the 222nd sub-touch sensing electrode 22b. The 22nd touch electrode line 22 is spaced apart from the 123rd sub-touch sensing electrode 12c and the 124th sub-touch sensing electrode 12d.

As shown in FIG. 6, the 12th touch electrode line 12, the 21st touch electrode line 21, and the 22nd touch electrode line 22 are adjacent to each other, and the edges of the touch sensing electrodes included in each of the touch electrode lines may include a plurality of vertices in a zigzag form, but not limited thereto. For example, the edge of the touch sensing electrodes may be a straight line or a curved line. Visibility of the touch electrode lines may be reduced by forming the edges of the touch sensing electrodes in a zigzag shape.

Meanwhile, the internal routing wiring 31 is disposed in the spaced area between the 122nd sub-touch sensing electrode 12b and the 123rd sub-touch sensing electrode 12c. The internal routing wiring 31 is spaced apart from the 122nd sub-touch sensing electrode 12b and the 123rd sub-touch sensing electrode 12c. The internal routing wiring 31 may be disposed on the same layer as the sub-touch sensing electrodes and may be formed of the same material as the sub-touch sensing electrodes.

A third ground wiring 51 may be further disposed in the spaced area between the 122nd sub-touch sensing electrode 12b and the 123rd sub-touch sensing electrode 12c. The third ground wiring 51 may be disposed in the spaced area between the 122nd sub-touch sensing electrode 12b and the internal routing wiring 31 and the spaced area between the internal routing wiring 31 and the 123rd sub-touch sensing electrode 12c. The third ground wiring 51 is spaced apart from the 122nd sub-touch sensing electrode 12b, the 123rd sub-touch sensing electrode 12c, and the internal routing wiring 31. The third ground wiring 51 may be disposed on the same layer as the sub-touch sensing electrodes and may be formed of the same material as the sub-touch sensing electrodes. The third ground wiring 51 may reduce noise of the signal transmitted through the internal routing wiring 31 by blocking the signal transmitted from the area adjacent to the internal routing wiring 31. Specifically, since the internal routing wiring 31 is connected to the 12th touch electrode line 12, the third ground wiring 51 prevents unnecessary capacitance formation between the touch signal transmitted through the 21st touch electrode line 21 and the 22nd touch electrode line 22 adjacent to the 12th touch electrode line 12 and the touch signal transmitted through the internal routing wiring 31.

Accordingly, as an open area OA is formed in the third ground wiring 51 disposed between the internal routing wiring 31 and the 123rd sub-touch sensing electrode 12c, the internal routing wiring 31 may be electrically connected to the 12th touch electrode line 12. The internal routing wiring 31 may be electrically connected to the 12th touch electrode line 12 according as the open area OA is formed in any one or both the third ground wirings 51 disposed between the internal routing wiring 31 and the adjacent sub-touch sensing electrode.

Since both the internal routing wiring 31 and the third ground wiring 51 are disposed adjacent to the sub-touch sensing electrodes, the internal routing wiring 31 and the third ground wiring 51 are formed to have the same shape as the sub-touch sensing electrodes. Accordingly, the internal routing wiring 31 and the third ground wiring 51 may have a zigzag shape, but not limited thereto. For example, the internal routing wiring 31 and the third ground wiring 51 may be in the form of a straight line or a curved line.

Figure 7:
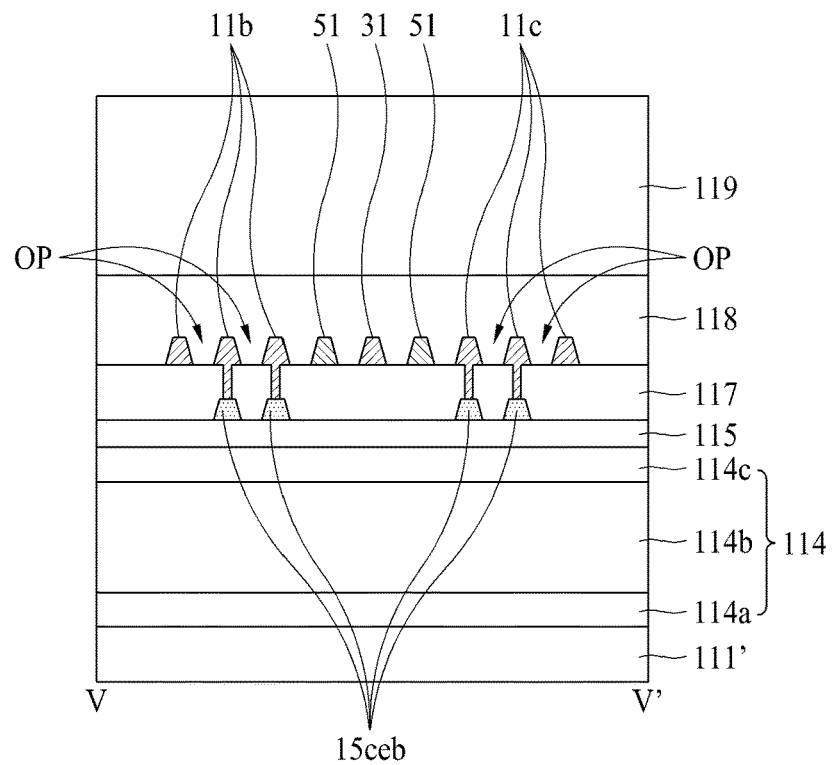
FIG. 7 is a cross sectional view along V-V' of FIG. 5 according to one embodiment of the present disclosure.

FIG. 7 is a cross sectional view along V-V' of FIG. 5 according to one embodiment. Specifically, FIG. 7 is a cross sectional view illustrating the contact electrode 15ceb connected to the 112th sub-touch sensing electrode 11b, the third ground wiring 51, the internal routing wiring 31, and the contact electrode 15ceb connected to the 113th sub-touch sensing electrode 11c in the 'Al' area of FIG. 5.

Referring to FIG. 7, an encapsulation layer 114 is disposed on a TFT substrate 111'. The TFT substrate 111' includes a substrate 111, a thin film transistor TFT disposed on the substrate 111, and a light emitting element ED disposed on the thin film transistor TFT (not shown in FIG. 7).

As described above, the encapsulation layer 114 may include a first inorganic encapsulation layer 114a, an organic encapsulation layer 114b, and a second inorganic encapsulation layer 114c.

A touch buffer layer 115 may be disposed on the encapsulation layer 114. The touch buffer layer 115 may be disposed under the first touch electrode line 10 and the second touch electrode line 20. The touch buffer layer 115 is disposed between the touch sensor and the light emitting element ED so that a separation distance between the touch sensor and the cathode electrode of the light emitting element ED may be designed to maintain a predetermined minimum separation distance. Accordingly, parasitic capacitance between the touch sensor and the cathode electrode may be reduced, and touch sensitivity degradation caused by parasitic capacitance may be prevented. In the same manner, the touch buffer layer 115 may also be disposed under the touch routing wiring.

The touch buffer layer 115 may be formed of an organic insulating material which may be formed at a low temperature of a predetermined temperature (for example, 100° C.) or less and may have a low dielectric constant (for example, 1-3) to prevent or at least reduce damage to a light emitting layer including an organic material vulnerable to a high temperature. For example, the touch buffer layer 115 may be formed of an acryl-based material, an epoxy-based material, or a siloxane-based material such as silicon nitride material SiNx. Also, the touch buffer layer 115 having planarization performance with an organic insulating material may prevent or at least reduce damage to the encapsulation layer 114 due to bending of the organic light emitting display device and breakage of the touch sensor disposed on the touch buffer layer 115.

The contact electrode 15ceb of the first connection electrode 15ce is disposed on the touch buffer layer 115. A touch insulating layer 117 is disposed on the contact electrode 15ceb. The touch insulating layer 117 may include an inorganic insulating material such as silicon nitride SiNx, silicon oxide SiOx, silicon oxynitride SiON, or aluminum oxide Al2O3.

The touch insulating layer 117 includes a plurality of contact holes formed in the area corresponding to the contact electrode 15ceb. The 112th sub-touch sensing electrode 11b, the third ground wiring 51, the internal routing wiring 31, and the 113th sub-touch sensing electrode 11c are disposed on the touch insulating layer 117. The 112th sub-touch sensing electrode 11b is connected to the contact electrode 15ceb through the contact hole formed in the touch insulating layer 117, and the 113th sub-touch sensing electrode 11c is connected to the contact electrode 15ceb through the contact hole formed in the touch insulating layer 117.

In FIG. 7, the 112th sub-touch sensing electrode 11b and the 113th sub-touch sensing electrode 11c are illustrated as a mesh type having a plurality of openings OP, but not limited thereto. For example, the 112th sub-touch sensing electrode 11b and the 113th sub-touch sensing electrode 11c may be plate-shaped electrode metal having no openings.

In other words, the first touch electrode line 10 and the second touch electrode line 20 may be a mesh type having a plurality of openings OP or a plate-shaped electrode metal without an opening. When the first touch electrode line 10 and the second touch electrode line 20 are in the mesh type having the plurality of openings OP, the touch electrode line may be a single layer or a plurality of layers formed of a conductive material such as aluminum Al, titanium Ti, silver Ag, and copper Cu. When the first touch electrode line 10 and the second touch electrode line 20 are in the plate-shaped electrode metal without the opening, the touch electrode line may be an electrode metal made of a transparent electrode material so that light emitted from the TFT substrate 111' may be transmitted upward.

The contact electrode 15ceb, the 11th touch electrode line 11, the third ground wiring 51, and the internal routing wiring 31 may be formed of the same material.

A touch protection layer 118 is disposed on the 11th touch electrode line 11, the third ground wiring 51, and the internal routing wiring 31. The touch protection layer 118 covers the 11th touch electrode line 118, the third ground wiring 51, and the internal routing wiring 31, thereby preventing or at least reducing wirings from being corroded by external moisture. The touch protection layer 118 may be formed of an organic insulating material such as an acrylic resin, an epoxy resin, polyimide, or the like.

A top module 119 such as a cover glass is attached to the touch protection layer 118 by an optical adhesive member such as optically clear adhesive OCA or optically clear resin OCR. In this case, a finger or a pen for touch is brought into contact with the cover glass.

Figure 8:
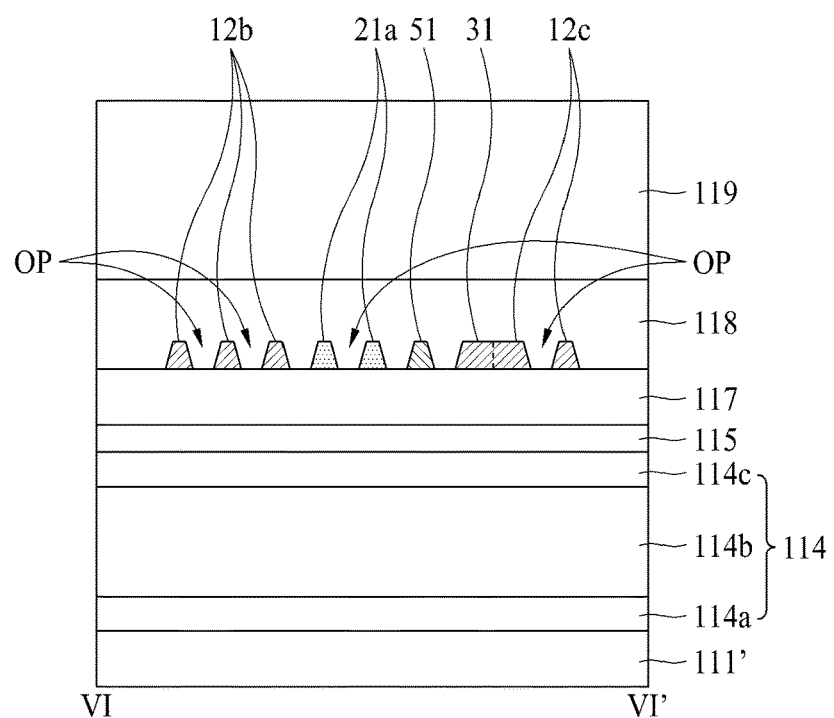
FIG. 8 is a cross sectional view along VI-VI' of FIG. 6 according to one embodiment of the present disclosure.

FIG. 8 is a cross sectional view along VI-VI' of FIG. 6 according to one embodiment. Specifically, FIG. 8 is a cross sectional view illustrating the 122nd sub-touch sensing electrode 12b, the third ground wiring 51, the internal routing wiring 31, the open area OA of the third ground wiring 51, and the 123rd sub-touch sensing electrode 12c in the 'A2' area of FIG. 6.

Referring to FIG. 8, it shows the cross section in which the internal routing wiring 31 is electrically connected to the 12th touch electrode line 12.

An encapsulation layer 114, a touch buffer layer 115, and a touch insulating layer 117 are disposed on a TFT substrate 111'. The 122nd sub-touch sensing electrode 12b, the 211th sub-touch sensing electrode 21a, the third ground wiring 51, the internal routing wiring 31, and the 123rd sub-touch sensing electrode 12c are disposed on the touch insulating layer 117.

In FIG. 8, the 122nd sub-touch sensing electrode 12b, the 211th sub-touch sensing electrode 21a, and the 123rd sub-touch sensing electrode 12c are illustrated as a mesh type having a plurality of openings OP, but not limited thereto. For example, the 122nd sub-touch sensing electrode 12b, the 211th sub-touch sensing electrode 21a, and the 123rd sub-touch sensing electrode 12c may be plate-shaped electrode metal having no openings. The 122nd sub-touch sensing electrode 12b, the 211th sub-touch sensing electrode 21a, the third ground wiring 51, the internal routing wiring 31, and the 123rd sub-touch sensing electrode 12c may be formed of the same material.

Referring to FIG. 6, the internal routing wiring 31 is connected to the 123rd sub-touch sensing electrode 12c through the open area OA. As shown in FIG. 8, in the open area OA, the internal routing wiring 31 is directly connected to the 123rd sub-touch sensing electrode 12c.

A touch protection layer 118 is disposed on the 12th touch electrode line 12, the 21st touch electrode line 21, the third ground wiring 51, and the internal routing wiring 31. A top module 119 such as a cover glass is attached to the touch protection layer 118 by an optical adhesive member such as optically clear adhesive OCA or optically clear resin OCR. In this case, a finger or a pen for touch is brought into contact with the cover glass.

Figure 9:
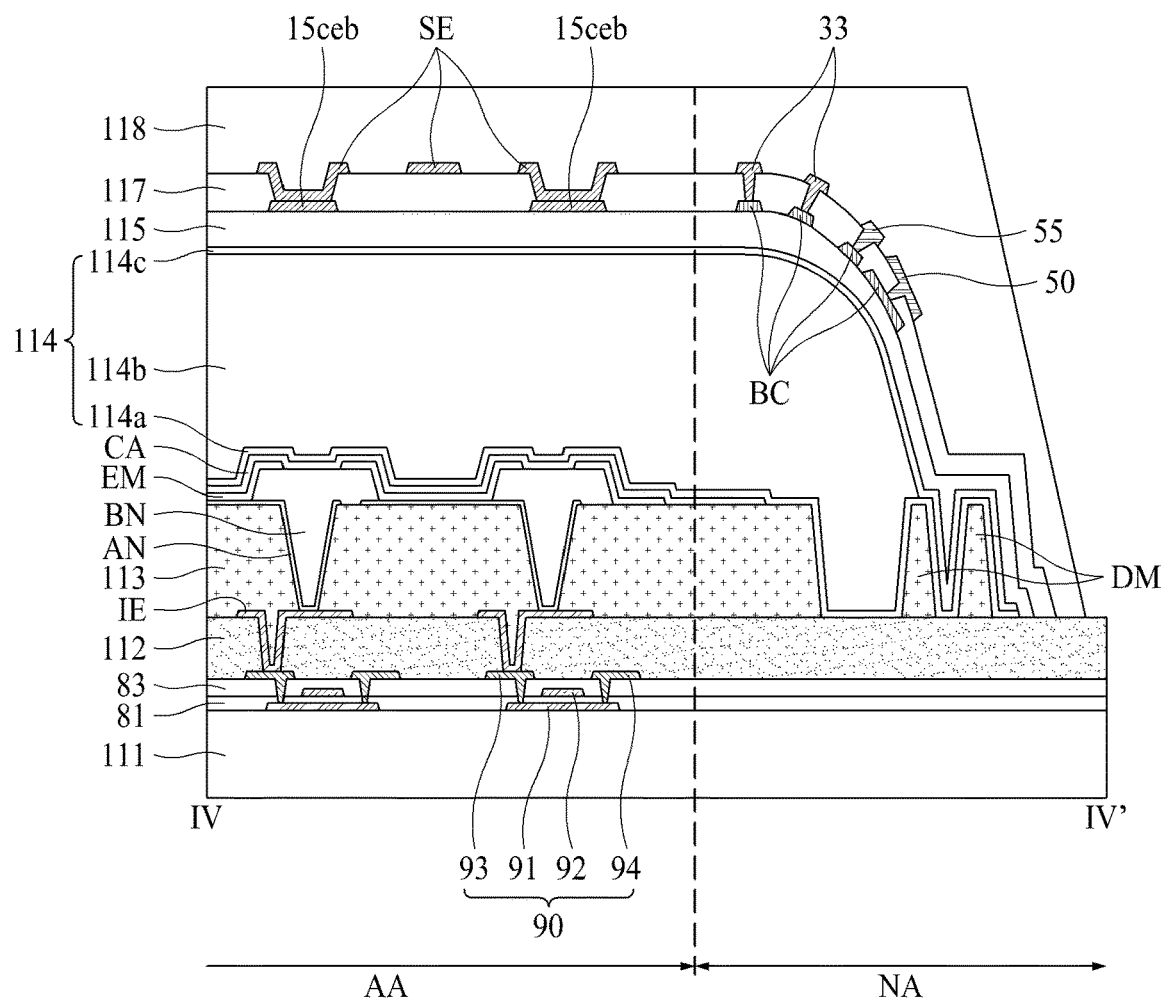
FIG. 9 is a cross sectional view along IV-IV' of FIG. 4 according to one embodiment of the present disclosure.

FIG. 9 is a cross sectional view along IV-IV' of FIG. 4 according to one embodiment. FIG. 9 shows the display area AA of the display panel 110, the non-display area NA of the display panel 110, and the boundary area between the display area AA and the non-display area NA. Repetitive explanation of the components described above will be omitted.

A thin film transistor 90 and a light emitting element ED are disposed on a substrate 111 in the display area AA. The substrate 111 may be formed of a flexible material such as glass or polyimide. A buffer layer may be additionally provided between the substrate 111 and the thin film transistor 90. The buffer layer may reduce penetration of moisture or impurities through the substrate 111.

In this case, the thin film transistor 90 represents the first transistor T1 described above.

In FIG. 9, the thin film transistor 90 is illustrated as a coplanar structure of a top gate, but not limited thereto. The structure of the thin film transistor 90 may be variously formed.

An active layer 91 is disposed on the substrate 111, and a gate insulating film 81 is disposed to cover the active layer 91. A gate electrode 92 is disposed on the gate insulating film 81 while being overlapped with the active layer 91, and a passivation layer 83 is disposed on the gate electrode 92 to cover the gate electrode 92. A source electrode 93 and a drain electrode 94 are disposed on the passivation layer 83. The source electrode 93 and the drain electrode 94 are connected to the active layer 91 through a contact hole formed in the passivation layer 83 and the gate insulating film 81. Both the gate insulating film 81 and the passivation layer 83 may be composed of a single layer or multiple layers of an inorganic insulating material such as silicon oxide SiOx or silicon nitride SiNx, but not limited thereto. The gate electrode 92, the source electrode 93, and the drain electrode 94 may include a conductive material, for example, copper Cu, aluminum Al, molybdenum Mo, nickel Ni, titanium Ti, chromium Cr, or an alloy thereof, but not limited thereto. The active layer 91 may be formed of a semiconductor material such as oxide semiconductor, amorphous silicon, or polysilicon, but not limited thereto.

A first planarization layer 112 for covering the thin film transistor 90 is disposed on the thin film transistor 90. An intermediate electrode IE is disposed on the first planarization layer 112, and the intermediate electrode IE is connected to the source electrode 93 through a contact hole formed in the first planarization layer 112. The intermediate electrode IE may be made of a conductive material, for example, copper Cu, aluminum Al, molybdenum Mo, nickel Ni, titanium Ti, chromium Cr, or an alloy thereof, but not limited thereto.

A second planarization layer 113 for covering the intermediate electrode IE is disposed on the intermediate electrode IE. An anode electrode AN is disposed on the second planarization layer 113, and the anode electrode AN is connected to the intermediate electrode IE through a contact hole formed in the second planarization layer 113. The anode electrode AN may be formed of a transparent conductive material, for example, indium tin oxide ITO or indium zinc oxide IZO, but not limited thereto.

Each of the first planarization layer 112 and the second planarization layer 113 is a layer for reducing a step difference thereunder and may be formed of an organic insulating material. For example, the first planarization layer 112 and the second planarization layer 113 may be formed of photo acryl, polyimide, benzocyclobutene-based resin, or acrylate-based resin.

A bank layer BN is disposed on the anode electrode AN and is configured to cover a portion of the anode electrode AN. The bank layer BN covers the edge portion of the anode electrode AN and covers a contact hole area of the second planarization layer 113 on which the anode electrode AN is disposed. The bank layer BN may be disposed at the boundary of the subpixels.

A light emitting layer EM is disposed between the bank layers BN adjacent to each other on the bank layer BN. A cathode electrode CA is disposed on the light emitting layer EM and is configured to cover the light emitting layer EM.

An encapsulation layer 114 for protecting the thin film transistor 90 and the light emitting element ED is disposed on the cathode electrode CA, and a touch buffer layer 115 is disposed on the encapsulation layer 114. A sensing electrode SE is disposed on the touch buffer layer 115, and a touch protection layer 118 is disposed on the sensing electrode SE to cover the sensing electrode SE.

The sensing electrode SE includes the first touch electrode line 10 and the second touch electrode line 20. In addition, a portion of the sensing electrode SE is disposed while being overlapped with the contact electrode 15ceb.

Meanwhile, in the non-display area NA, a dam DM may be disposed on the same layer as the second planarization layer 113. The dam DM may prevent the encapsulation layer 114, more particularly, an organic encapsulation layer 114b, from overflowing to the outside of the substrate 111. Accordingly, two dams DM may be disposed side by side as shown in the drawing, but not limited thereto. For example, three dams DM may be disposed. The dam DM may be formed of a single layer or a plurality of layers. For example, the dam DM may be formed in a double-layered structure in which the second planarization layer 113 and the bank layer BN are stacked, or a three-layered structure in which the first planarization layer 112, the second planarization layer 113, and the bank layer BN are stacked.

A first inorganic encapsulation layer 114a and a second inorganic encapsulation layer 114c may be disposed onto the edge portion of the substrate 111 beyond the two dams DM. The organic encapsulation layer 114b does not exceed the dam DM disposed in the periphery.

The touch buffer layer 115 and the touch insulating layer 117 may also extend to the non-display area NA.

The external routing wiring 33, the second ground wiring 55, and the first ground wiring 50 may be disposed in the non-display area NA and may be formed in a double layer structure. In detail, the external routing wiring 33, the second ground wiring 55, and the first ground wiring 50 may be implemented in the form of a double layer in which conductive layers are disposed above and below the touch insulating layer 117 and the conductive layers formed on the upper and lower portions are connected through contact holes formed in the touch insulating layer 117. The conductive layer disposed under the touch insulating layer 117 in the non-display area NA may be formed of the same material on the same layer as the contact electrode 15ceb and may be referred to as a lower conductive layer BC. Accordingly, it is possible to reduce the resistance of the external routing wiring 33, the second ground wiring 55, and the first ground wiring 50.

The touch protection layer 118 may protect the wirings by covering not only the sensing electrode SE but also the external routing wiring 33, the second ground wiring 55, and the first ground wiring 50 disposed in the non-display area NA.

Figure 10:
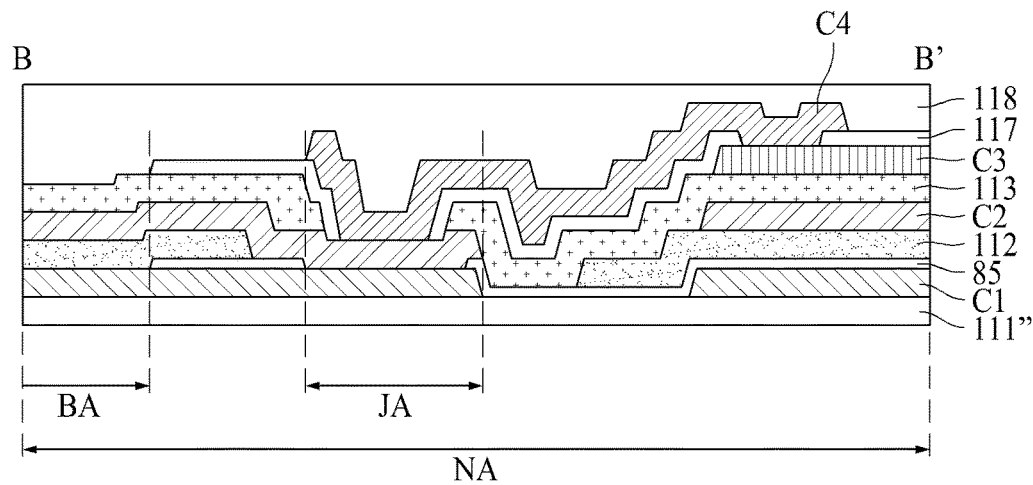
FIG. 10 is a cross sectional view along B-B' of FIG. 4 according to one embodiment of the present disclosure.

FIG. 10 is a cross sectional view along B-B' of FIG. 4 according to one embodiment. The non-display area NA, a jumping area JA, and the bending area BA of the display panel 110 are show in FIG. 10. Repetitive explanation of the components described above will be omitted.

The jumping area JA is the area (or jumping) where wirings contacts another wiring passing through the bending area BA before the wirings pass through the bending area BA.

The bending area BA corresponds to the boundary between the first display panel area 110a and the second display panel area 110b, and the second display panel area 110b may be bent and overlap the rear surface of the first display panel area 110a owing to the bending area BA.

A first conductive layer C1 is disposed on a support substrate 111" of the non-display area NA. The support substrate 111" is a component including a substrate 111, a gate insulating film 81, and a passivation layer 83, and is briefly represented as one layer, for convenience. The first conductive layer C1 may be formed of the same material as a source electrode 93 and a drain electrode 94 and may be provided on the same layer as the source electrode 93 and the drain electrode 94. The first conductive layer C1 may be connected to the source electrode 93 or the drain electrode 94 while being disposed in the non-display area NA and may also be referred to as a link wiring. In addition, the first conductive layer C1 may be additionally disposed in the jumping area JA and the bending area BA.

A first planarization layer 112 is disposed on the first conductive layer C1, and a second conductive layer C2 is disposed on the first planarization layer 112. The first planarization layer 112 is disposed in the non-display area NA except for the jumping area JA, to thereby prevent an electrical connection between the first conductive layer C1 and the second conductive layer C2.

The second conductive layer C2 may be disposed on the same layer as the intermediate electrode IE in the non-display area NA and may be formed of the same material as the intermediate electrode IE. The second conductive layer C2 contacts the first conductive layer C1 in the jumping area JA. The second conductive layer C2 may be disposed in the bending area BA together with the first conductive layer C1, but not limited thereto. For example, any one of the first conductive layer C1 and the second conductive layer C2 may be disposed in the bending area BA, or both the first conductive layer C1 and the second conductive layer C2 may be disposed in the bending area BA while being not overlapped with each other.

An insulating layer 85 may be additionally disposed between the first conductive layer C1 and the first planarization layer 112. The insulating layer 85 may be disposed in the non-display area NA except for the jumping area JA and the bending area BA, and may also be disposed on the thin film transistor 90 in the display area AA. The insulating layer 85 may be formed of an inorganic insulating material, such as silicon nitride SiNx, silicon oxide SiOx, silicon oxynitride SiON, and the like.

A second planarization layer 113 is disposed on the second conductive layer C2. The second planarization layer 113 is disposed in the non-display area NA except for the jumping area JA.

A third conductive layer C3 is disposed on the second planarization layer 113 of the non-display area NA, a touch insulating layer 117 is disposed on the third conductive layer C3, and a fourth conductive layer C4 is disposed on the touch insulating layer 117. The third conductive layer C3 may be formed of the same material as the lower conductive layer and disposed on the same layer as the lower conductive layer BC, and the fourth conductive layer C4 may be formed of the same material as the sensing electrode SE and disposed on the same layer as the sensing electrode SE. The third conductive layer C3 and the fourth conductive layer C4 are electrodes constituting the touch routing wirings 30 and 40 and are connected to the vicinity of the bending area BA. The third conductive layer C3 and the fourth conductive layer C4 contact each other in the non-display area NA through the open area of the touch insulating layer 117, and the fourth conductive layer C4 is disposed while being connected to the jumping area JA.

The touch insulating layer 117 is opened in the jumping area JA, and the second conductive layer C2 and the fourth conductive layer C4 contact each other through the open portion of the touch insulating layer 117. In the jumping area JA, the first conductive layer C1, the second conductive layer C2, and the fourth conductive layer C4 are electrically connected. The touch signals provided through the touch routing wirings 30 and 40 are transmitted to the first conductive layer C1 and the second conductive layer C2 in the jumping area JA through the fourth conductive layer C4, and are provided to the touch pad in the first touch pad area LPA or the second touch pad area RPA through the first conductive layer C1 and/or the second conductive layer C2 disposed in the bending area BA.

Referring to FIG. 4, the above-mentioned jumping area JA may be disposed on the bending area BA. Additionally, the jumping area JA may be disposed under the bending area BA.

Only the organic insulating materials of the first planarization layer 112, the second planarization layer 113, and the touch protection layer 118 may be disposed in the bending area BA, to thereby prevent or at least reduce or at least reduce a crack of the display panel 110 and disconnection of the first conductive layer C1 and/or the second conductive layer C2.

The display device according to the various embodiments of the present disclosure may be described as follows.

The display device according to one embodiment of the present disclosure may include a substrate including a display area in which a plurality of subpixels are disposed and a non-display area excluding the display area, an encapsulation layer for covering the plurality of subpixels, a first touch electrode line including a plurality of first touch sensing electrodes disposed in a first direction on the encapsulation layer and spaced apart from each other in the first direction, a second touch electrode line provided in the same plane as the first touch electrode line and disposed in a second direction crossing the first direction, a plurality of pads disposed on one side of the substrate, a first touch routing wiring configured to connect some of the first touch electrode line and some among the plurality of pads and disposed between the plurality of first touch sensing electrodes in the second direction, and a second touch routing wiring configured to connect the second touch electrode line to some other pads among the plurality of pads.

According to another feature of the present disclosure, a connection line configured to connect the first touch sensing electrodes adjacent to each other in the first direction among the plurality of first touch sensing electrodes may be further included. The connection line may be disposed on a different layer from the first touch electrode line and the second touch electrode line.

According to another feature of the present disclosure, the connection line may be disposed on a different layer from the first touch electrode line and the second touch electrode line.

According to another feature of the present disclosure, the first touch electrode line and the second touch electrode line may have a rectangular shape, a rhombus shape, or a triangular shape.

According to another feature of the present disclosure, the edge of each of the first touch electrode line and the second touch electrode line may have a zigzag shape.

According to another feature of the present disclosure, a portion of the first touch routing wiring may be disposed in the display area.

According to another feature of the present disclosure, the first touch routing wiring may be disposed on the same layer as the first touch electrode line.

According to another feature of the present disclosure, the second touch routing wiring may be disposed in the non-display area and be a double wiring in which two electrodes are overlapped.

According to another feature of the present disclosure, one of the two electrodes, which is disposed on a lower portion, may be disposed on the same layer as the connection wiring and is formed of the same material as the connection wiring.

According to another feature of the present disclosure, the substrate may include a first area in which the first touch electrode line and the second touch electrode line are disposed, a second area protruding from the first area, and a bending area disposed between the first area and the second area and configured to bend the second area to a rear surface of the first area.

According to another feature of the present disclosure, the plurality of subpixels may include a pixel circuit including a plurality of thin film transistors, and a light emitting element, a plurality of wiring disposed on the same layer as some of the electrodes constituting the plurality of thin film transistors are disposed in the bending area, and the first touch electrode line and the second touch electrode line are connected to the plurality of wirings.

According to another feature of the present disclosure, the second area may include a jumping area configured to connect the first touch electrode line and the plurality of wirings, and the second touch electrode line and the plurality of wirings in an area adjacent to the bending area.

According to another feature of the present disclosure, the display device may further include a ground wiring disposed between the first touch routing wiring and the plurality of first touch sensing electrodes in the display area.

According to another feature of the present disclosure, the ground wiring may be disposed on the same layer as the plurality of first touch sensing electrodes and the first touch routing wiring and be spaced apart from the plurality of first touch sensing electrodes and the first touch routing wiring.

According to another feature of the present disclosure, the ground electrode may be disposed along the circumference of the substrate in the non-display area, and a ground voltage may be applied to the ground electrode.

According to another feature of the present disclosure, in some touch routing wirings of the first touch routing wiring and the second touch routing wiring, a constant resistance structure for adjusting resistance in the first touch routing wiring and the second touch routing wiring may be disposed close to the pad area.

According to another feature of the present disclosure, A display device may include a substrate including a display area in which a plurality of subpixels are disposed and a non-display area excluding the display area, a dam disposed close to the boundary between the display area and the non-display area on the substrate, an encapsulation layer for covering the plurality of subpixels and the dam, a first touch electrode line including a plurality of first touch sensing electrodes disposed in a first direction on the encapsulation layer and spaced apart from each other in the first direction, a second touch electrode line provided in the same plane as the first touch electrode line and disposed in a second direction crossing the first direction, a first touch routing wiring connected to the first touch electrode line in the display area and disposed in the second direction between the plurality of first touch sensing electrodes, and a second touch routing wiring connected to the second touch electrode line in the non-display area.

According to another feature of the present disclosure, the display device may further include a connection line configured to connect the two adjacent first touch sensing electrodes among the plurality of first touch sensing electrodes under the first touch electrode line.

According to another feature of the present disclosure, the display device may further include a ground wiring disposed between the first touch routing wiring and the plurality of first touch sensing electrodes in the display area.

According to another feature of the present disclosure, the substrate may include a data driving circuit disposed on one surface of the substrate, and pads disposed on left and right sides of the data driving circuit and connected to the first touch routing wiring and the second touch routing wiring, wherein one end of the ground wiring may be connected to one of the pads disposed on the left side and the other end of the ground wiring may be connected to one of the pads disposed on the right side.

According to the embodiment of the present disclosure, the touch electrode line and the touch routing wiring are disposed on the same layer in the display area of the display panel so that it is possible to reduce the size of the non-display area.

According to the embodiment of the present disclosure, the ground wiring is additionally disposed between the touch sensing electrode and the touch routing wiring disposed in the display area, static electricity may be quickly discharged through the ground wiring so as not to be affected by static electricity during touch sensing, thereby preventing the touch sensing error or the degradation of sensing sensitivity.

It will be apparent to those skilled in the art that various substitutions, modifications, and variations are possible within the scope of the present disclosure without departing from the spirit and scope of the present disclosure. Therefore, the scope of the present disclosure is represented by the following claims, and all changes or modifications derived from the meaning, range and equivalent concept of the claims should be interpreted as being included in the scope of the present disclosure.

What is claimed is:

1. A display device comprising:
    a substrate including a display area and a non-display area that excludes the display area, the display area including a plurality of subpixels;
    an encapsulation layer that covers the plurality of subpixels;
    a first touch electrode line including a plurality of first touch sensing electrodes disposed in a first direction on the encapsulation layer, the plurality of first touch sensing electrodes spaced apart from each other in the first direction;
    a second touch electrode line in a same plane as the first touch electrode line, the second touch electrode line in a second direction that crosses the first direction;
    a plurality of pads on one side of the substrate;
    a first touch routing wiring configured to connect some of the first touch electrode line and some pads among the plurality of pads, the first touch routing wiring between the plurality of first touch sensing electrodes in the second direction; and
    a second touch routing wiring configured to connect the second touch electrode line to some other pads among the plurality of pads.

2. The display device according to claim 1, further comprising:
    a connection line configured to connect first touch sensing electrodes among the plurality of first touch sensing electrodes that are adjacent to each other in the first direction.

3. The display device according to claim 2, wherein the connection line is on a different layer from the first touch electrode line and the second touch electrode line.

4. The display device according to claim 1, wherein the first touch electrode line and the second touch electrode line have a rectangular shape, a rhombus shape, or a triangular shape.

5. The display device according to claim 4, wherein an edge of each of the first touch electrode line and the second touch electrode line has a zigzag shape.

6. The display device according to claim 1, wherein a portion of the first touch routing wiring is in the display area.

7. The display device according to claim 6, wherein the first touch routing wiring is on a same layer as the first touch electrode line.

8. The display device according to claim 6, wherein the second touch routing wiring is in the non-display area and is a double wiring in which two electrodes overlap.

9. The display device according to claim 8, wherein one of the two electrodes, which is disposed on a lower portion, is disposed on a same layer as a connection wiring and is comprises a same material as the connection wiring.

10. The display device according to claim 1, wherein the substrate includes:
    a first area in which the first touch electrode line and the second touch electrode line are disposed;
    a second area protruding from the first area; and
    a bending area between the first area and the second area, the bending area configured to bend the second area to a rear surface of the first area.

11. The display device according to claim 10, wherein the plurality of subpixels include a pixel circuit including a plurality of thin film transistors, and a light emitting element, a plurality of wirings disposed on a same layer as some electrodes constituting the plurality of thin film transistors and the plurality of wirings in the bending area, and the first touch electrode line and the second touch electrode line are connected to the plurality of wirings.

12. The display device according to claim 11, wherein the second area includes a jumping area configured to connect the first touch electrode line and the plurality of wirings, and the second touch electrode line and the plurality of wirings in an area adjacent to the bending area.

13. The display device according to claim 1, further comprising:
   a ground wiring between the first touch routing wiring and the plurality of first touch sensing electrodes in the display area.

14. The display device according to claim 13, wherein the ground wiring is on a same layer as the plurality of first touch sensing electrodes and the first touch routing wiring, and is spaced apart from the plurality of first touch sensing electrodes and the first touch routing wiring.

15. The display device according to claim 13, wherein the ground electrode is along a circumference of the substrate in the non-display area, and a ground voltage is applied to the ground electrode.

16. The display device according to claim 1, wherein, in some touch routing wirings of the first touch routing wiring and the second touch routing wiring, a constant resistance structure for adjusting resistance in the first touch routing wiring and the second touch routing wiring is disposed adjacent to a pad area.

17. A display device comprising:
   a substrate including a display area and a non-display area that excludes the display area, the display area including a plurality of subpixels;
   a dam disposed adjacent to a boundary between the display area and the non-display area on the substrate;
   an encapsulation layer that covers the plurality of subpixels and the dam;
   a first touch electrode line including a plurality of first touch sensing electrodes disposed in a first direction on the encapsulation layer, the plurality of first touch sensing electrodes spaced apart from each other in the first direction;
   a second touch electrode line in a same plane as the first touch electrode line, the second touch electrode line in a second direction that crosses the first direction;
   a first touch routing wiring connected to the first touch electrode line in the display area and disposed in the second direction between the plurality of first touch sensing electrodes; and
   a second touch routing wiring connected to the second touch electrode line in the non-display area.

18. The display device according to claim 17, further comprising:
   a connection line configured to connect two adjacent first touch sensing electrodes among the plurality of first touch sensing electrodes under the first touch electrode line.

19. The display device according to claim 17, further comprising:
   a ground wiring between the first touch routing wiring and the plurality of first touch sensing electrodes in the display area.

20. The display device according to claim 19, wherein the substrate includes:
   a data driving circuit on one surface of the substrate; and
   pads disposed on a left side and a right side of the data driving circuit, the pads connected to the first touch routing wiring and the second touch routing wiring,
   wherein one end of the ground wiring is connected to one of the pads on the left side and another end of the ground wiring is connected to one of the pads on the right side.

* * * * *